US012772890B2

United States Patent
Lin et al.

(10) Patent No.: US 12,772,890 B2
(45) Date of Patent: Oct. 20, 2026

(54) SEMICONDUCTOR PACKAGE AND FABRICATION METHOD THEREOF

(71) Applicant: UNITED MICROELECTRONICS CORP., Hsin-Chu City (TW)

(72) Inventors: Da-Jun Lin, Kaohsiung City (TW); Bin-Siang Tsai, Changhua County (TW); Fu-Yu Tsai, Tainan City (TW); Tai-Cheng Hou, Tainan City (TW)

(73) Assignee: UNITED MICROELECTRONICS CORP., Hsin-Chu City (TW)

(*) Notice: Subject to any disclaimer, the term of this patent is extended or adjusted under 35 U.S.C. 154(b) by 389 days.

(21) Appl. No.: 18/539,321

(22) Filed: Dec. 14, 2023

(65) Prior Publication Data

US 2025/0140666 A1 May 1, 2025

(30) Foreign Application Priority Data

Oct. 27, 2023 (TW) ................................ 112141172

(51) Int. Cl.

| | |
|---|---|
| ***H10W 10/17*** | (2026.01) |
| ***H10W 70/685*** | (2026.01) |
| ***H10W 74/00*** | (2026.01) |
| ***H10W 74/10*** | (2026.01) |
| ***H10W 90/00*** | (2026.01) |
| *H10W 72/20* | (2026.01) |
| *H10W 72/90* | (2026.01) |

(52) U.S. Cl.

CPC ......... *H10W 70/685* (2026.01); *H10W 74/00* (2026.01); *H10W 74/111* (2026.01); *H10W 90/701* (2026.01); *H10W 72/244* (2026.01); *H10W 72/252* (2026.01); *H10W 72/9226* (2026.01); *H10W 72/923* (2026.01); *H10W 72/942* (2026.01); *H10W 74/142* (2026.01)

(58) Field of Classification Search

CPC ............. H10W 90/701; H10W 70/685; H10W 74/117; H10W 74/15; H10W 90/00; H10W 90/724; H10W 90/734; H10W 90/754; H10W 72/851; H10W 90/722; H10W 70/60; H10W 70/614; H10W 72/20; H10B 80/00; H10P 72/7424; H10P 72/743; H10P 72/74

USPC .......................................................... 257/700

See application file for complete search history.

(56) References Cited

U.S. PATENT DOCUMENTS

| | | | |
|---|---|---|---|
| 9,508,674 | B2 | 11/2016 | Pan |
| 10,056,350 | B2 | 8/2018 | Lin |
| 11,637,084 | B2 | 4/2023 | Yu |

(Continued)

*Primary Examiner* — Theresa T Doan

(74) *Attorney, Agent, or Firm* — Winston Hsu

(57) ABSTRACT

A semiconductor package includes a RDL interposer having a first surface and a second surface; fanout pads and peripheral pads on the second surface; a first semiconductor die on the first surface and electrically connected to the fanout pads; a molding compound surrounding the first semiconductor die and the first surface of the RDL interposer; through mold vias in the molding compound around the first semiconductor die; peripheral solder bumps within the through mold vias and directly disposed on the peripheral pads; through silicon via pads on the rear surface of the first semiconductor die; a second semiconductor die bonded to the through silicon via pads of the first semiconductor die and the peripheral solder bumps within the through mold vias.

16 Claims, 7 Drawing Sheets

(56) References Cited

U.S. PATENT DOCUMENTS

2019/0333893 A1 * 10/2019 Yu .......................... H10W 90/00
2021/0242158 A1 * 8/2021 Lee .......................... H10P 72/74

* cited by examiner

SEMICONDUCTOR PACKAGE AND FABRICATION METHOD THEREOF

BACKGROUND OF THE INVENTION

1. Field of the Invention

The present invention relates to the field of semiconductor technology, and in particular to an improved semiconductor package and a manufacturing method thereof.

2. Description of the Prior Art

The semiconductor industry is currently undergoing the most radical change in its history. Many new applications such as artificial intelligence (AI), augmented/virtual reality, and autonomous driving require enormous computing power with processors optimized specifically for each application. At the same time, development cycles are becoming shorter, costs for new chip designs are rising exponentially.

The rising costs and complexity associated with scaling have driven the semiconductor industry to turn to 3D integration and heterogeneous integration to increase performance on new device generations supporting these new applications. Die-to-wafer hybrid bonding is an enabling process to accelerate the deployment of 3D/heterogeneous integration and bring about new generations of devices with high bandwidth, high performance, and low power consumption.

SUMMARY OF THE INVENTION

It is one object of the present invention to provide an improved 3DIC package and a manufacturing method thereof to solve the deficiencies or shortcomings of the existing technology.

One aspect of the invention provides a semiconductor package including a re-distribution layer (RDL) interposer having a first surface and a second surface opposite to the first surface; a plurality of fanout pads disposed on the second surface of the RDL interposer; a plurality of peripheral pads disposed on the second surface and arranged along a perimeter of the RDL interposer; a first semiconductor die disposed on the first surface of the RDL interposer and electrically connected to the plurality of fanout pads; a molding compound encapsulating the first semiconductor die and the first surface of the RDL interposer, wherein a top surface of the molding compound is coplanar with a rear surface of the first semiconductor die; a plurality of through mold vias disposed in the molding compound around the first semiconductor die, wherein the plurality of through mold vias exposes the plurality of peripheral pads, respectively; a plurality of peripheral solder bumps disposed within the plurality of through mold vias and placed directly on the plurality of peripheral pads, respectively; a plurality of through silicon via (TSV) pads disposed on the rear surface of the first semiconductor die; and a second semiconductor die bonded to the plurality of TSV pads of the first semiconductor die and bonded to the plurality of peripheral solder bumps within the plurality of through mold vias.

According to some embodiments, the plurality of peripheral pads surrounds the plurality of fanout pads.

According to some embodiments, the second semiconductor die is bonded to the plurality of TSV pads of the first semiconductor die through a plurality of first connecting elements.

According to some embodiments, the plurality of first connecting elements comprises micro-bumps.

According to some embodiments, the second semiconductor die is bonded to the plurality of peripheral solder bumps within the plurality of through mold vias through a plurality of second connecting elements having a diameter greater than a diameter of each of the plurality of first connecting elements.

According to some embodiments, the plurality of second connecting elements comprises metal stud bumps.

According to some embodiments, the metal stud bumps comprise gold stud bumps, silver stud bumps, aluminum stud bumps, or copper stud bumps.

According to some embodiments, the semiconductor package further includes a plurality of third connecting elements disposed on the fanout pads and on the peripheral pads on the second surface of the RDL interposer.

According to some embodiments, the plurality of third connecting elements comprises C4 bumps.

According to some embodiments, the semiconductor package further includes a filler material layer disposed within the plurality of through mold vias, wherein the filler material layer surrounds the peripheral solder bumps and the second connecting elements.

Another aspect of the invention provides a method for forming a semiconductor package. A re-distribution layer (RDL) interposer having a first surface and a second surface opposite to the first surface is provided. A plurality of fanout pads and a plurality of peripheral pads are formed on the second surface of the RDL interposer. A first semiconductor die is formed on the first surface of the RDL interposer and is electrically connected to the plurality of fanout pads. A molding compound is formed to encapsulate the first semiconductor die and the first surface of the RDL interposer, wherein a top surface of the molding compound is coplanar with a rear surface of the first semiconductor die. A plurality of through mold vias is formed in the molding compound around the first semiconductor die, wherein the plurality of through mold vias exposes the plurality of peripheral pads, respectively. A plurality of peripheral solder bumps is formed within the plurality of through mold vias and directly on the plurality of peripheral pads, respectively. A plurality of through silicon via (TSV) pads is formed on the rear surface of the first semiconductor die. A second semiconductor die is bonded to the plurality of TSV pads of the first semiconductor die and the plurality of peripheral solder bumps within the plurality of through mold vias.

According to some embodiments, the plurality of peripheral pads surrounds the plurality of fanout pads.

According to some embodiments, the second semiconductor die is bonded to the plurality of TSV pads of the first semiconductor die through a plurality of first connecting elements.

According to some embodiments, the plurality of first connecting elements comprises micro-bumps.

According to some embodiments, the second semiconductor die is bonded to the plurality of peripheral solder bumps within the plurality of through mold vias through a plurality of second connecting elements having a diameter greater than a diameter of each of the plurality of first connecting elements.

According to some embodiments, the plurality of second connecting elements comprises metal stud bumps.

According to some embodiments, the metal stud bumps comprise gold stud bumps, silver stud bumps, aluminum stud bumps, or copper stud bumps.

According to some embodiments, the method further includes the step of forming a plurality of third connecting elements on the fanout pads and on the peripheral pads on the second surface of the RDL interposer.

According to some embodiments, the plurality of third connecting elements comprises C4 bumps.

According to some embodiments, the method further includes the step of forming a filler material layer within the plurality of through mold vias, wherein the filler material layer surrounds the peripheral solder bumps and the second connecting elements.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
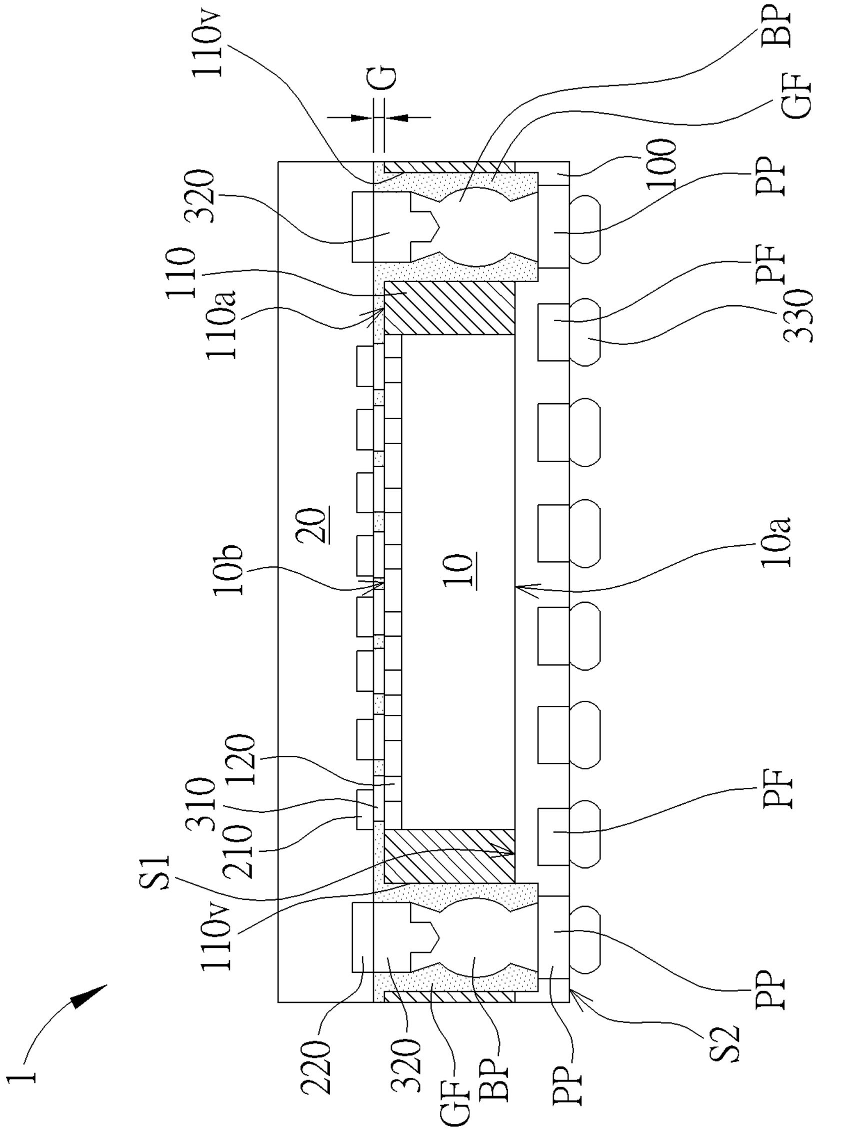
FIG. 1 is a schematic cross-sectional diagram of a semiconductor package according to an embodiment of the present invention.

Please refer to FIG. 1, which is a schematic cross-sectional diagram of a semiconductor package according to an embodiment of the present invention. The semiconductor package 1 includes a re-distribution layer (RDL) interposer 100 having a first surface S1 and a second surface S2 opposite to the first surface S1. A plurality of fanout pads PF is provided on the second surface S2 of the redistribution layer interposer 100. A plurality of peripheral pads PP is provided on the second surface S2 and arranged along the perimeter of the redistribution layer interposer 100. According to an embodiment of the present invention, on the second surface S2, the plurality of peripheral pads PP surrounds the plurality of fanout pads PF.

According to an embodiment of the present invention, the semiconductor package 1 further includes a first semiconductor die 10 disposed on the first surface S1 of the redistribution layer interposer 100 and electrically connected to the plurality of fanout pads PF. According to an embodiment of the present invention, the first semiconductor die 10 may be, for example, a logic die or a memory die, but is not limited thereto.

According to an embodiment of the present invention, the fanout pads PF are electrically connected to the input/output (I/O) pads on the front surface 10*a* of the first semiconductor die 10 via the interconnect structure in the redistribution layer interposer 100. For the sake of simplicity, the interconnect structure in the redistribution layer interposer 100 and the I/O pads of the first semiconductor die 10 are not shown in the figures.

According to an embodiment of the present invention, the semiconductor package 1 further includes a molding compound 110 that encapsulates the first semiconductor die 10 and the first surface S1 of the redistribution layer interposer 100. The top surface 110*a* of the molding compound 110 is in coplanar with the rear surface 10*b* of the first semiconductor die 10. According to an embodiment of the present invention, the molding compound 110 does not cover the front surface 10*a* or the rear surface 10*b* of the first semiconductor die 10, but only covers and surround the peripheral sidewalls of the first semiconductor die 10.

According to an embodiment of the present invention, the semiconductor package 1 further includes a plurality of through mold vias 110*v* disposed in the molding compound 110 around the first semiconductor die 10. According to an embodiment of the present invention, the through mold vias 110*v* penetrate through the molding compound 110 and extend into the first surface S1 of the redistribution layer interposer 100 to a predetermined depth until the plurality of peripheral pads PP is exposed. According to an embodiment of the present invention, the plurality of through mold vias 110*v* respectively expose the plurality of peripheral pads PP.

According to an embodiment of the present invention, the semiconductor package 1 further includes a plurality of peripheral solder bumps BP, which are disposed in a plurality of through mold vias 110*v* and respectively directly placed on the plurality of peripheral pads PP. According to an embodiment of the present invention, the height of the peripheral solder bump BP exceeds, for example, half the depth of the through mold via 110*v*, and the top surface of the peripheral solder bump BP does not protrude from the top surface 110*a* of the molding compound 110.

According to an embodiment of the present invention, the semiconductor package 1 further includes a plurality of through silicon via (TSV) pads 120 disposed on the rear surface 10*b* of the first semiconductor die 10. According to an embodiment of the present invention, the plurality of through silicon via pads 120 penetrates into a predetermined depth on the rear surface 10*b* of the first semiconductor die 10. For example, the predetermined depth is approximately equal to the thickness of the semiconductor substrate 101 of the first semiconductor die 10, but not limited to this.

According to an embodiment of the present invention, the semiconductor package 1 further includes a second semiconductor die 20, a plurality of through silicon via pads 120 bonded to the first semiconductor die 10, and a plurality of peripheral solder bumps BP in the plurality of through mold vias 110*v*. According to an embodiment of the present invention, the second semiconductor die 20 may be, for example, a display driver integrated circuit (DDIC), but is not limited thereto. According to an embodiment of the present invention, the second semiconductor die 20 is bonded to the plurality of through silicon via pads 120 of the first semiconductor die 10 through a plurality of first connecting elements 310. According to an embodiment of the present invention, the plurality of first connecting elements 310 includes micro-bumps. According to an embodiment of the present invention, the molding compound 110 does not directly contact the second semiconductor die 20, and a gap G is formed between the molding compound 110 and the second semiconductor die 20.

According to an embodiment of the present invention, the second semiconductor die 20 is bonded to the plurality of peripheral solder bumps BP in the plurality of through mold vias 110*v* through a plurality of second connecting elements 320, and the diameter of the second connecting elements 320 is larger than the diameter of the first connecting elements 310.

According to an embodiment of the present invention, the first connecting element 310 electrically connects the bond pad 210 of the second semiconductor die 20 with the through-silicon via pad 120, and the second connecting element 320 electrically connects the peripheral pad 220 of the second semiconductor die 20 with the peripheral solder bump BP. According to an embodiment of the present invention, the plurality of second connecting elements 320 include metal stud bumps, such as gold stud bumps, silver stud bumps, aluminum stud bumps or copper stud bumps. The above metal stud bumps can be formed using a wire bonder. According to an embodiment of the present invention, the size of the peripheral pad 220 of the second semiconductor die 20 is larger than the size of the bond pad 210.

According to an embodiment of the present invention, high-frequency signals can be transmitted between the first semiconductor die 10 and the second semiconductor die 20 through the first connecting elements 310 and the through-silicon via pads 120, and the high-voltage power signals for the second semiconductor die 20 can be transmitted through the second connecting elements 320 and the peripheral solder bumps BP.

According to an embodiment of the present invention, the semiconductor package 1 further includes a filler material layer GF disposed in the plurality of through mold vias 110*v*. The filler material layer GF surrounds the peripheral solder bumps BP and the second connecting element 320 in each through mold via 110*v*. According to an embodiment of the present invention, the filler material layer GF completely fills the gap G between the molding compound 110 and the second semiconductor die 20 and surrounds the plurality of first connecting elements 310.

According to an embodiment of the present invention, the semiconductor package 1 further includes a plurality of third connecting elements 330 disposed on the fanout pads PF and the peripheral pads PP on the second surface S2 of the redistribution layer interposer 100. According to an embodiment of the present invention, the plurality of third connecting elements 330 may include C4 bumps (C4: abbreviation of Controlled Collapse Chip Connection), but is not limited thereto.

Figure 2:
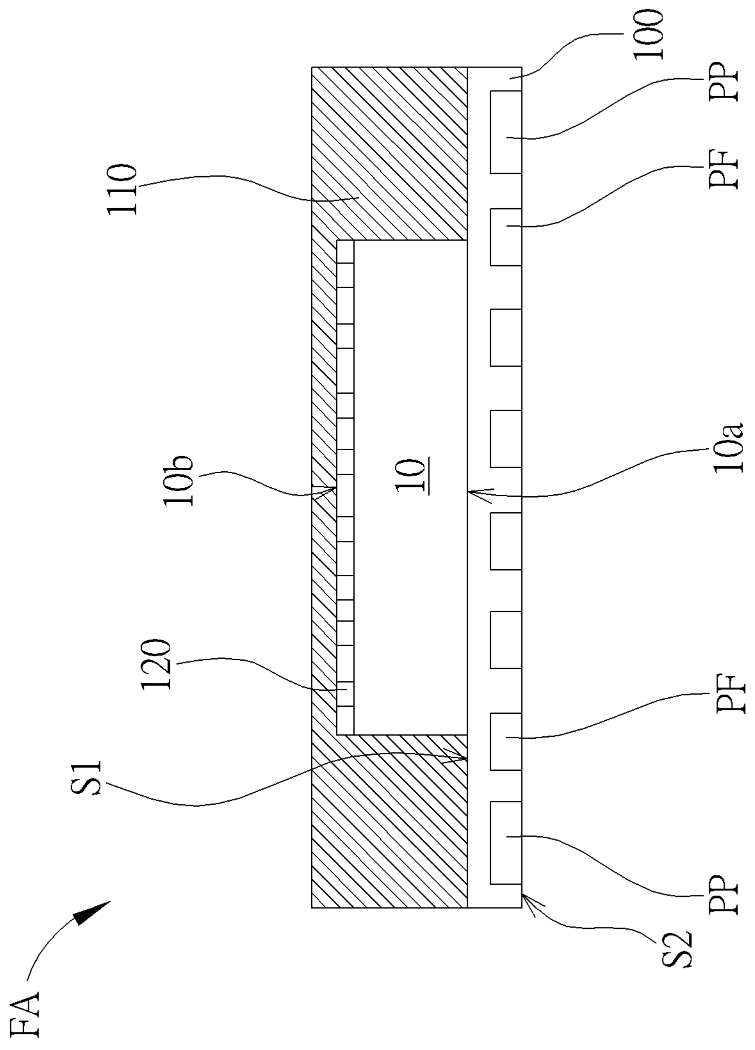
FIG. 2 to FIG. 7 are schematic diagrams showing a method of forming a semiconductor package according to an embodiment of the present invention.

Please refer to FIG. 2 to FIG. 7, which are schematic diagrams showing a method of forming a semiconductor package according to an embodiment of the present invention. As shown in FIG. 2, a fanout package FA is provided, which includes a redistribution layer interposer 100. The redistribution layer interposer 100 has a first surface S1 and a second surface S2 opposite to the first surface S1. A plurality of fanout pads PF is provided on the second surface S2 of the redistribution layer interposer 100. A plurality of peripheral pads PP is provided on the second surface S2 and arranged along the perimeter of the redistribution layer interposer 100. According to an embodiment of the present invention, on the second surface S2, the plurality of peripheral pads PP surrounds the plurality of fanout pads PF.

The fanout package FA further includes a first semiconductor die 10 that is disposed on the first surface S1 of the redistribution layer interposer 100 and that is electrically connected to the plurality of fanout pads PF. According to an embodiment of the present invention, the first semiconductor die 10 may be, for example, a through-silicon via (TSV) logic die or a TSV memory die, but is not limited thereto.

According to an embodiment of the present invention, the fanout pad PF is electrically connected to the input/output (I/O) pad on the front surface 10*a* of the first semiconductor die 10 via the interconnect structure in the redistribution layer interposer 100. For the sake of simplicity, the interconnect structure in the redistribution layer interposer 100 and the I/O pads of the first semiconductor die 10 are not shown in the figures.

According to an embodiment of the present invention, a plurality of through silicon via pads 120 is provided on the rear surface 10*b* of the first semiconductor die 10. According to an embodiment of the present invention, the plurality of through silicon via pads 120 penetrates into a predetermined depth on the rear surface 10*b* of the first semiconductor die 10. For example, the predetermined depth is approximately equal to the thickness of the semiconductor substrate 101 of the first semiconductor die 10.

According to an embodiment of the present invention, the fanout package FA further includes a molding compound 110 that encapsulates the first semiconductor die 10, the first surface S1 of the redistribution layer interposer 100, and the plurality of through silicon via pads 120 on the rear surface 10*b* of the first semiconductor die 10.

Figure 3:
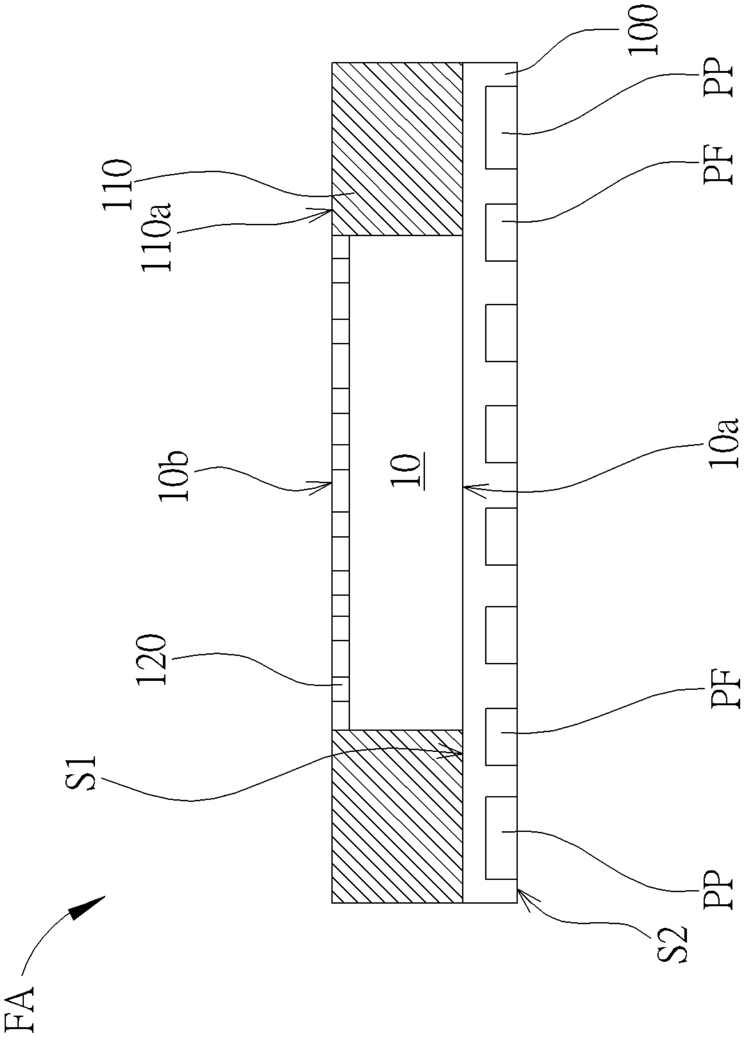

As shown in FIG. 3, the molding compound 110 is subjected to a polishing process, such as a chemical mechanical polishing process, to make the top surface 110*a* of the molding compound 110 and the rear surface 10*b* of the first semiconductor die 10 coplanar. At this point, the molding compound 110 does not cover the front surface 10*a* or the rear surface 10*b* of the first semiconductor die 10, but only covers and surrounds the sidewalls of the first semiconductor die 10, exposing the plurality of through silicon via pads 120 on the rear surface 10*b* of the first semiconductor die 10.

Figure 4:
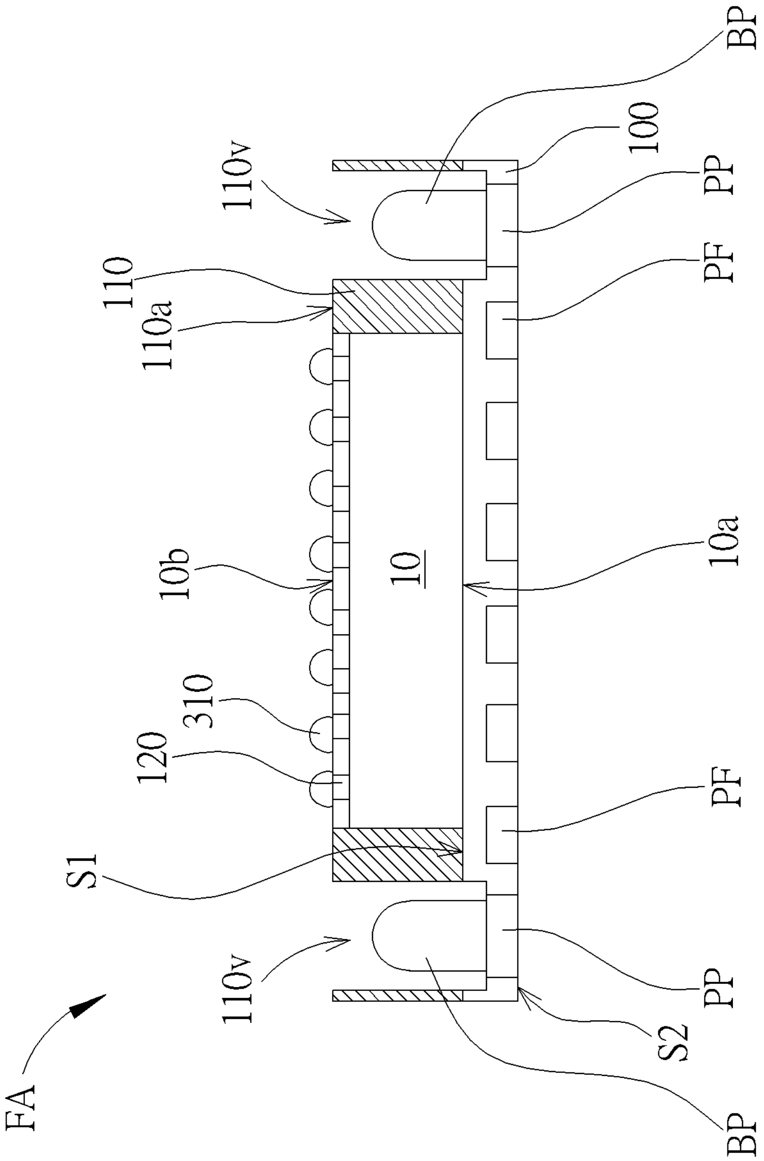

As shown in FIG. 4, a plurality of through mold vias 110*v* is then formed in the molding compound 110 around the first semiconductor die 10 by etching. According to an embodiment of the present invention, the through mold vias 110*v* penetrate through the molding compound 110 and extend into the first surface S1 of the redistribution layer interposer 100 to a predetermined depth until the plurality of peripheral pads PP are exposed. According to an embodiment of the present invention, the through mold vias 110*v* respectively expose the peripheral pads PP.

Subsequently, peripheral solder bumps BP are formed on the peripheral pads PP in the through mold vias 110*v*, respectively. According to an embodiment of the present invention, for example, the height of the peripheral solder bump BP exceeds half the depth of the through mold via 110*v*. The top surface of the peripheral solder bump BP does not protrude from the top surface 110*a* of the molding compound 110. At the same time, the first connecting elements 310 are formed on the through silicon via pads 120, respectively. According to an embodiment of the present invention, the first connecting elements 310 include micro-bumps. The diameter of the peripheral solder bump BP is larger than the diameter of the first connecting element 310.

Figure 5:
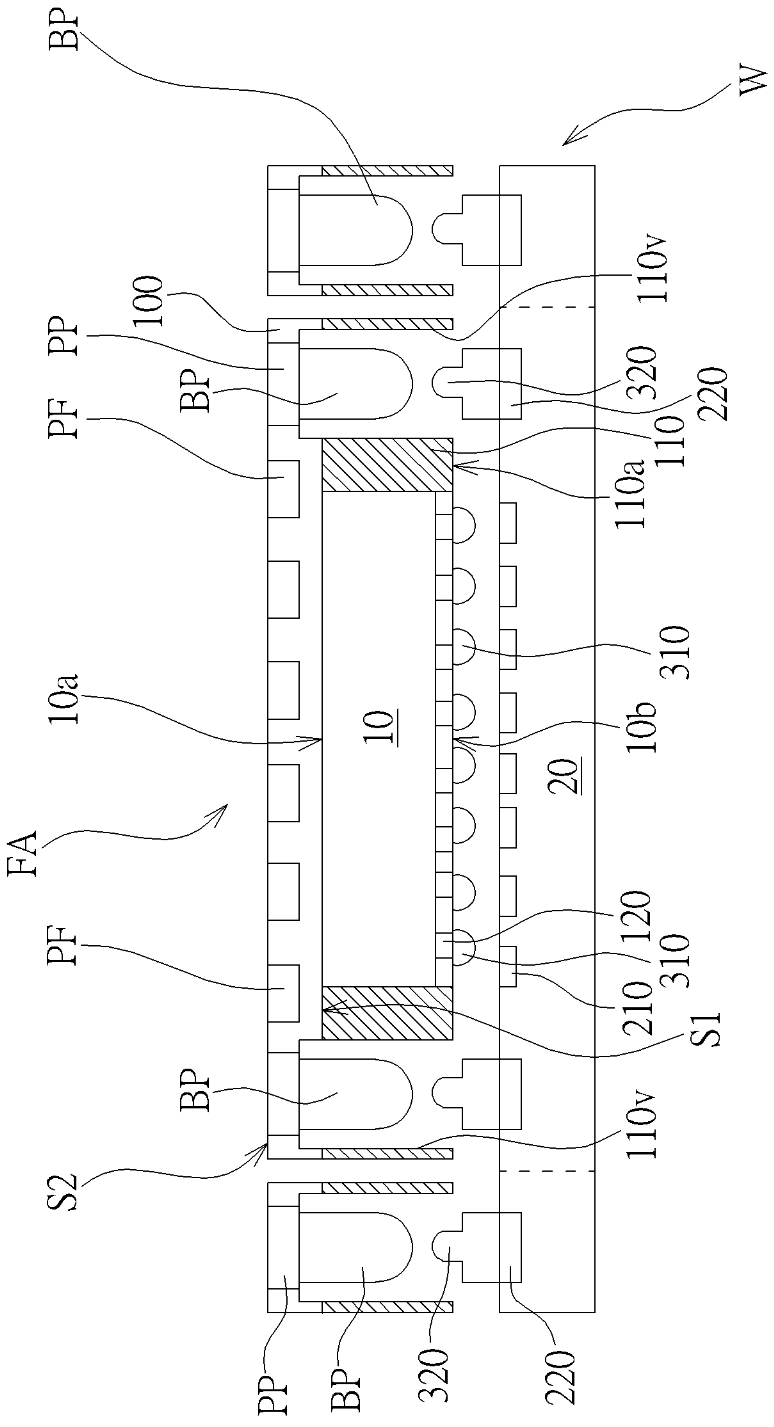
Figure 6:
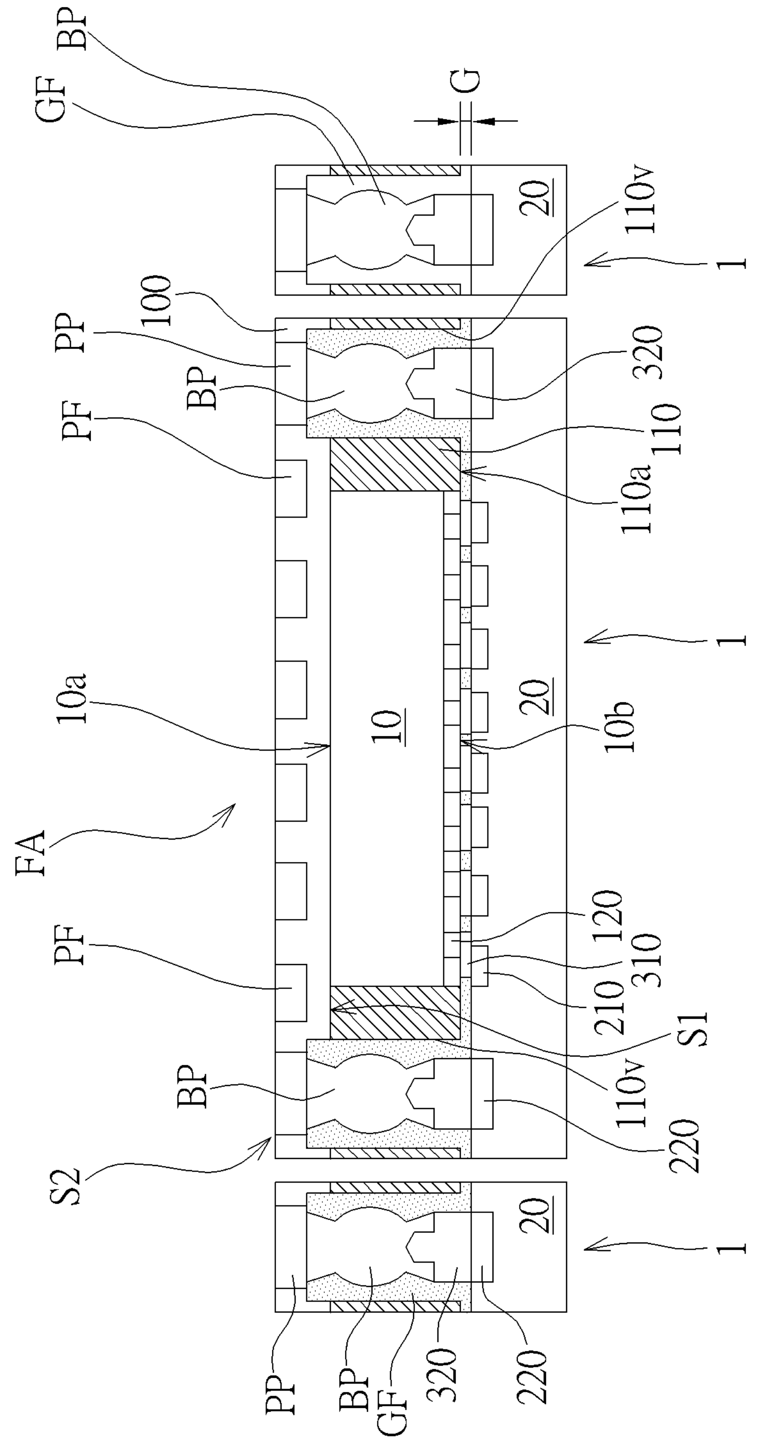

As shown in FIGS. 5-6, a wafer W on which a plurality of second semiconductor dies 20 is formed is provided (each second semiconductor die 20 is separated by a dotted line). According to an embodiment of the present invention, the second semiconductor die 20 may be, for example, a display driver chip, but is not limited thereto. The second semiconductor die 20 includes bond pads 210 and peripheral pads 220. According to an embodiment of the present invention, second connecting elements 320 are provided on the peripheral pads 220 of the second semiconductor die 20, respectively. According to an embodiment of the present invention, the second connecting elements 320 include metal stud bumps, for example, gold stud bumps, silver stud bumps, aluminum stud bumps, or copper stud bumps. The above metal stud bumps can be formed using a wire bonder.

Subsequently, the fanout package FA in FIG. 4 is flipped upside down and assembled onto each second semiconductor die 20 of the wafer W using die-to-wafer bonding. At this point, the bond pads 210 and peripheral pads 220 of the second semiconductor die 20 are respectively connected to the through-silicon via pads 120 and the peripheral solder bumps BP within the through mold vias 110*v* of the first semiconductor die 10 through the first connecting elements 310 and the second connecting elements 320. When performing the die-to-wafer bonding, the second connecting elements 320 on the second semiconductor die 20 can be used as a positioning post to increase the positioning accuracy during assembly.

According to an embodiment of the present invention, the second semiconductor die 20 is bonded to the plurality of through silicon via pads 120 of the first semiconductor die 10 through the plurality of first connecting elements 310. According to an embodiment of the present invention, the first connecting element 310 is electrically connected to the bond pad 210 of the second semiconductor die 20 and the through-silicon via pad 120, and the second connecting element 320 is electrically connected to the peripheral pad 220 of the second semiconductor die 20 and the peripheral solder bump BP.

According to an embodiment of the present invention, the second semiconductor die 20 is bonded to the plurality of peripheral solder bumps BP in the plurality of through mold vias 110*v* through the plurality of second connecting elements 320, and the diameter of the second connecting element 320 is larger than the diameter of the first connecting element 310. According to an embodiment of the present invention, the size of the peripheral pad 220 of the second semiconductor die 20 is larger than the size of the bond pad 210.

According to an embodiment of the present invention, the peripheral solder bump BP may be slightly squeezed and deformed by the second connecting member 320 to form a zigzag sidewall profile. According to an embodiment of the present invention, the peripheral solder bump BP may not directly contact the molding compound 110. A reflow process can be performed subsequently to form a tight bond between the second connecting element 320 and the peripheral solder bump BP.

Subsequently, a wafer cutting process is performed to cut along the dotted line of the wafer W, thus forming the semiconductor package 1. The plurality of through mold vias 110*v* are then filled with a filler material layer GF, such as resin or other suitable underfill. The filler material layer GF surrounds the peripheral solder bumps BP and the second connecting elements 320. According to an embodiment of the present invention, the filler material layer GF completely fills the gap G between the molding compound 110 and the second semiconductor die 20 and surrounds the plurality of first connecting elements 310.

Figure 7:
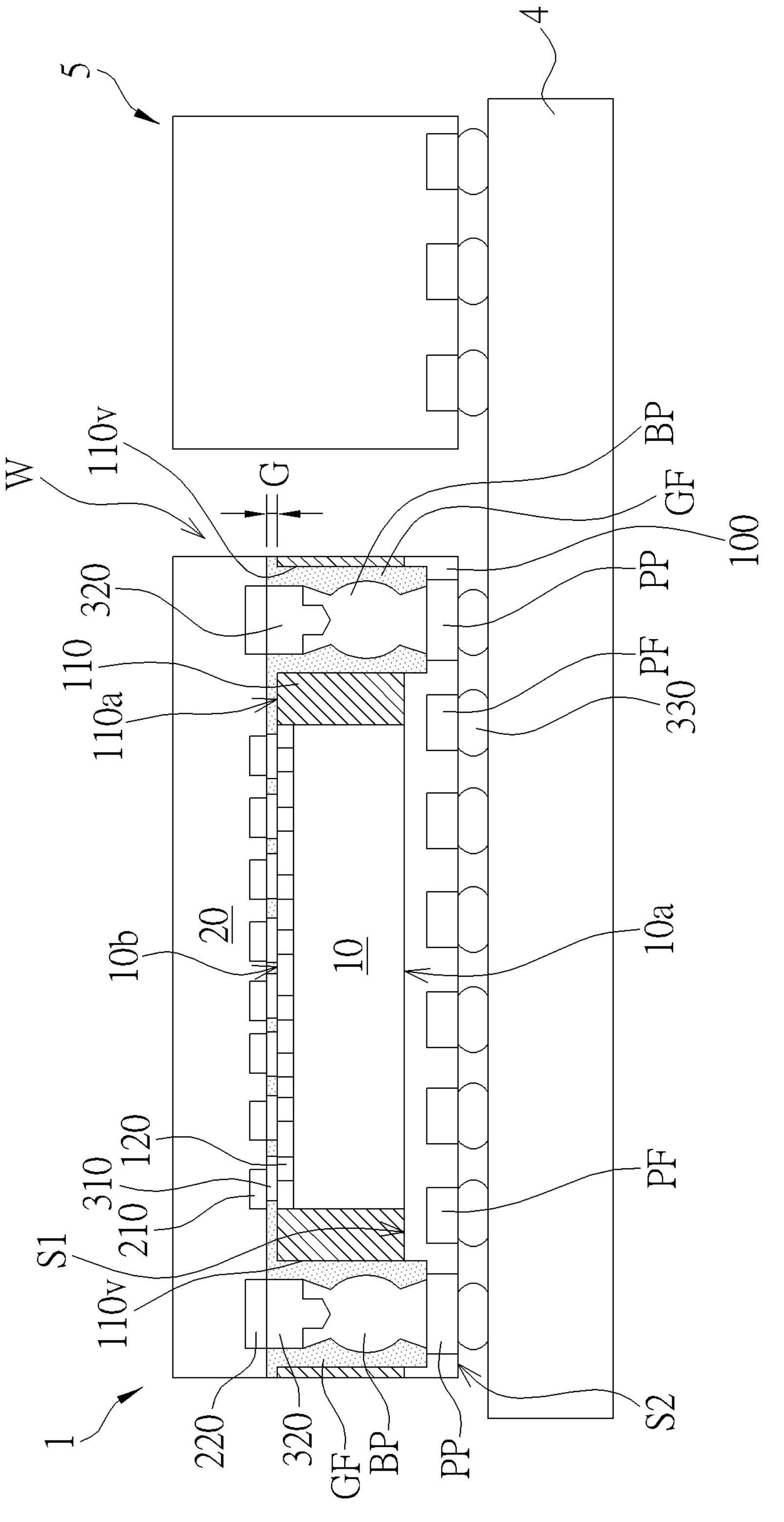

As shown in FIG. 7, the semiconductor package 1 formed in FIG. 6 is flipped upside down and assembled onto the circuit board 4 through the third connecting elements 330. According to an embodiment of the present invention, the third connecting elements 330 are disposed on the fanout pad PF and the peripheral pad PP on the second surface S2 of the redistribution layer interposer 100. According to an embodiment of the present invention, the third connecting elements 330 include C4 bumps. According to an embodiment of the present invention, the circuit board 4 may be a printed circuit board (PCB) or a system board, but is not limited thereto. According to an embodiment of the present invention, electronic components 5 may be further provided on the circuit board 4.

According to an embodiment of the present invention, high-frequency signals can be transmitted between the first semiconductor die 10 and the second semiconductor die 20 through the first connecting elements 310 and the through-silicon via pads 120. The high voltage power signals for the second semiconductor die 20 can be directly transmitted from the circuit board 4 through the second connecting elements 320 and the peripheral solder bumps BP. In addition, the signals can be transmitted between the second semiconductor die 20 and the electronic component 5 through a shorter path formed by the second connecting elements 320 and the peripheral solder bumps BP.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:

a re-distribution layer (RDL) interposer having a first surface and a second surface opposite to the first surface;

a plurality of fanout pads disposed on the second surface of the RDL interposer;

a plurality of peripheral pads disposed on the second surface and arranged along a perimeter of the RDL interposer;

a first semiconductor die disposed on the first surface of the RDL interposer and electrically connected to the plurality of fanout pads;

a molding compound encapsulating the first semiconductor die and the first surface of the RDL interposer, wherein a top surface of the molding compound is coplanar with a rear surface of the first semiconductor die;

a plurality of through mold vias disposed in the molding compound around the first semiconductor die, wherein the plurality of through mold vias exposes the plurality of peripheral pads, respectively;

a plurality of peripheral solder bumps disposed within the plurality of through mold vias and placed directly on the plurality of peripheral pads, respectively;

a plurality of through silicon via (TSV) pads disposed on the rear surface of the first semiconductor die; and a second semiconductor die bonded to the plurality of TSV pads of the first semiconductor die and bonded to the plurality of peripheral solder bumps within the plurality of through mold vias, wherein the second semiconductor die is bonded to the plurality of TSV pads of the first semiconductor die through a plurality of first connecting elements, wherein the second semiconductor die is bonded to the plurality of peripheral solder bumps within the plurality of through mold vias through a plurality of second connecting elements having a diameter greater than a diameter of each of the plurality of first connecting elements.

2. The semiconductor package according to claim 1, wherein the plurality of peripheral pads surrounds the plurality of fanout pads.

3. The semiconductor package according to claim 1, wherein the plurality of first connecting elements comprises micro-bumps.

4. The semiconductor package according to claim 1, wherein the plurality of second connecting elements comprises metal stud bumps.

5. The semiconductor package according to claim 4, wherein the metal stud bumps comprise gold stud bumps, silver stud bumps, aluminum stud bumps, or copper stud bumps.

6. The semiconductor package according to claim 1 further comprising:

a plurality of third connecting elements disposed on the fanout pads and on the peripheral pads on the second surface of the RDL interposer.

7. The semiconductor package according to claim 6, wherein the plurality of third connecting elements comprises C4 bumps.

8. The semiconductor package according to claim 1 further comprising:

a filler material layer disposed within the plurality of through mold vias, wherein the filler material layer surrounds the peripheral solder bumps and the second connecting elements.

9. A method for forming a semiconductor package, comprising:

providing a re-distribution layer (RDL) interposer having a first surface and a second surface opposite to the first surface;

forming a plurality of fanout pads and a plurality of peripheral pads on the second surface of the RDL interposer;

forming a first semiconductor die on the first surface of the RDL interposer and electrically connected to the plurality of fanout pads;

forming a molding compound encapsulating the first semiconductor die and the first surface of the RDL interposer, wherein a top surface of the molding compound is coplanar with a rear surface of the first semiconductor die;

forming a plurality of through mold vias in the molding compound around the first semiconductor die, wherein the plurality of through mold vias exposes the plurality of peripheral pads, respectively;

forming a plurality of peripheral solder bumps within the plurality of through mold vias and directly on the plurality of peripheral pads, respectively;

forming a plurality of through silicon via (TSV) pads on the rear surface of the first semiconductor die; and bonding a second semiconductor die to the plurality of TSV pads of the first semiconductor die and the plurality of peripheral solder bumps within the plurality of through mold vias, wherein the second semiconductor die is bonded to the plurality of TSV pads of the first semiconductor die through a plurality of first connecting elements, wherein the second semiconductor die is bonded to the plurality of peripheral solder bumps within the plurality of through mold vias through a plurality of second connecting elements having a diameter greater than a diameter of each of the plurality of first connecting element.

10. The method according to claim 9, wherein the plurality of peripheral pads surrounds the plurality of fanout pads.

11. The method according to claim 9, wherein the plurality of first connecting elements comprises micro-bumps.

12. The method according to claim 9, wherein the plurality of second connecting elements comprises metal stud bumps.

13. The method according to claim 12, wherein the metal stud bumps comprise gold stud bumps, silver stud bumps, aluminum stud bumps, or copper stud bumps.

14. The method according to claim 9 further comprising:

forming a plurality of third connecting elements on the fanout pads and on the peripheral pads on the second surface of the RDL interposer.

15. The method according to claim 14, wherein the plurality of third connecting elements comprises C4 bumps.

16. The method according to claim 9 further comprising:

forming a filler material layer within the plurality of through mold vias, wherein the filler material layer surrounds the peripheral solder bumps and the second connecting elements.

* * * * *